United States Patent
Lee et al.

(10) Patent No.: US 7,958,625 B2
(45) Date of Patent: Jun. 14, 2011

(54) ASSEMBLY DEVICE

(75) Inventors: Chia-Hung Lee, Taipei (TW);
Jen-Huan Yu, Taipei (TW);
Chung-Shao Huang, Taipei County (TW); Ching-Feng Hsieh, Taipei (TW);
Cheng-Wen Dai, Taipei (TW);
Kuo-Ching Chen, Taipei (TW)

(73) Assignee: Askey Computer Corp., Taipei (TW)

( * ) Notice: Subject to any disclaimer, the term of this patent is extended or adjusted under 35 U.S.C. 154(b) by 39 days.

(21) Appl. No.: 12/365,969

(22) Filed: Feb. 5, 2009

(65) Prior Publication Data
US 2010/0095518 A1    Apr. 22, 2010

(30) Foreign Application Priority Data

Oct. 20, 2008 (TW) .............................. 97140155 A

(51) Int. Cl.
*B23P 19/00*    (2006.01)
*H05K 3/36*    (2006.01)
(52) U.S. Cl. ................. 29/739; 29/757; 29/761; 29/830
(58) Field of Classification Search .................... 29/761, 29/739, 757, 830
See application file for complete search history.

(56) References Cited

U.S. PATENT DOCUMENTS

| | | | | |
|---|---|---|---|---|
| 4,206,539 | A * | 6/1980 | Weresch ................. | 29/566.3 |
| 5,617,627 | A * | 4/1997 | Semple et al. ................. | 29/509 |
| 6,769,173 | B2 * | 8/2004 | Chadbourne ................. | 29/761 |
| 6,782,608 | B2 * | 8/2004 | Ohsumi et al. ................. | 29/753 |
| 7,637,003 | B2 * | 12/2009 | Imgrut et al. ................. | 29/739 |
| 2002/0039525 | A1 * | 4/2002 | Bejerano ................. | 414/222.02 |
| 2002/0042988 | A1 * | 4/2002 | Jansson ................. | 29/832 |
| 2004/0168309 | A1 * | 9/2004 | Aluffo ................. | 29/764 |
| 2004/0172810 | A1 * | 9/2004 | Aluffo ................. | 29/761 |
| 2005/0000089 | A1 * | 1/2005 | Fu ................. | 29/739 |
| 2007/0113398 | A1 * | 5/2007 | Jonasson ................. | 29/751 |
| 2007/0207637 | A1 * | 9/2007 | Ito et al. ................. | 439/74 |
| 2008/0043453 | A1 * | 2/2008 | Horng ................. | 361/818 |
| 2008/0172865 | A1 * | 7/2008 | Yagi et al. ................. | 29/753 |
| 2008/0209716 | A1 * | 9/2008 | Yagi et al. ................. | 29/753 |
| 2008/0291602 | A1 * | 11/2008 | Devoe ................. | 361/306.3 |
| 2009/0019912 | A1 * | 1/2009 | Yu et al. ................. | 72/402 |

FOREIGN PATENT DOCUMENTS
CN    201063966 Y    5/2008

* cited by examiner

*Primary Examiner* — A. Dexter Tugbang
*Assistant Examiner* — David P Angwin
(74) *Attorney, Agent, or Firm* — Rabin & Berdo, P.C.

(57) ABSTRACT

An assembly device includes a base having a supporting portion upon which an isolation cover and a main body are disposed. A press-fitting mechanism is movably connected to the base, and includes a press-fitting portion facing the supporting portion and disposed corresponding in position to the supporting portion, and further portions for guiding and bending second positioning portions. The further portions are movably disposed on external side faces of the press-fitting portion. The press-fitting mechanism also has first portions for holding the further portions to the external side faces of the press-fitting portion, and has second portions passing through upper ends of the further portions. A drive mechanism is disposed at the base and has a drive portion connected to the press-fitting mechanism, for driving the press-fitting mechanism to move towards the supporting portion via the drive portion, so as to bend and fasten ends of second positioning portions.

20 Claims, 12 Drawing Sheets

ASSEMBLY DEVICE

BACKGROUND OF THE INVENTION

1. Field of the Invention

The present invention relates to an assembly technology, and more particularly to an assembly device applicable to a circuit board.

2. Related Art

When a wireless product performs the data wireless transmission under a high power state, the high frequency harmonic waves are extremely easily generated by non-linear characteristics of active components, so as to result in an electromagnetic interference (EMI) emission, which is often the prime contributor to the performance degradation. In order to solve the problem, legal regulations are imposed by many countries to restraint illegal input applications and utilizations of the wireless product. Accordingly, when the designers and manufactures of the wireless product design a control line of the wireless product, the legal requirements of wireless applications must be complied and incorporated into the wireless design. The circuit of the wireless product is also affected by the signals of the external electromagnetic wave, such as, radio frequency (RF) wireless signals. Therefore, performance inconsistencies can occur easily in the wireless products.

Therefore, it is a critical factor for the designers and developers to know how to effectively eliminate the interference and the noise in order to improve the performance of the wireless products. One of conventional methods is to use an isolation cover disposed on a circuit board to eliminate the interference. As shown in FIG. 1, an isolation cover 22 is fully soldered onto a main body 20 of a circuit board 2 by adopting a surface mount technology (SMT), such that the isolation cover 22 can cover part of components on the circuit board 2, such as, the chip(s) located on a surface of the main body 20 of the circuit board 2. Then, a reflow-soldering process is performed on the circuit board 2 through a tin oven (not shown).

However, this conventional method is used a soldering technique called a single piece fully soldering process to solder the isolation cover 22 entirely onto the main body 20. After the reflow-soldering process, if some of the components underneath the isolation cover 22 fail, a desoldering process must be performed to detach the isolation cover 22 in order to replace the corresponding components. In this manner, the maintenance is costly, and the repairing process is time consuming, and the isolation cover 22 can be easily deformed, more significantly, the detached isolation cover 22 cannot be reused. As a result, the fabrication cost of the conventional method is extremely high.

In order to solve the disadvantage of the single piece fully soldering technology, a two-piece fully soldering technology is proposed, as shown in FIG. 2. A lower frame 24 and an upper cover 26 are used to replace the single piece isolation cover. During assembling, the lower frame 24 is firstly soldered to the main body 20 of a circuit board 2'. The upper cover 26 is utilized to cover the main body 20 of the circuit board 2' after the circuit board 2' passing through the tin oven, in such that the upper cover 26 can be integrated to the lower frame 24.

However, the requirements of performing the two-piece fully soldering process are more complicated, and the cost is relatively higher. Moreover, since it needs to solder the lower frame 24 first and then perform a secondary processing on the upper cover 26 after passing through the tin stove, the number of the steps in the assembly process is increased.

Meanwhile, since both the above single-piece fully soldering technology and two-piece fully soldering technology need to perform the soldering by using the solder, the main body and elements thereon are often damaged due to heat generated during the soldering process which can easily result in the defect of the SMT process of having a high defective fraction.

Some conventional methods are proposed to resolve the above-mentioned problems, such as the methods disclosed in PRC Utility Model Patent Publication No. CN201063966Y, and US Patent Publication Application No. 2008/0043453 A1. In the PRC Utility Model Patent Publication No. CN201063966Y, the isolation cover is used to cover the entire circuit board, and an elastic arm with an inward end is designed to clamp the periphery of the circuit board. In the US Patent Publication Application No. 2008/0043453 A1, the surface of the partial circuit board is covered by the isolation cover passing through the circuit board, and an interfering structure with an outward end is designed to fix the isolation cover on the circuit board.

In both teachings, solder tin is not an essential requirement to perform the soldering process. However, the elastic arm or the interfering structure is easily deformed by the high temperature resulted in the subsequent process, thereby affecting the buckling force to cause the falling of the isolation cover.

From the above-mentioned methods, the conventional arts have many problems, therefore, it is an objective of the present invention to provide a technology for assembling a circuit board, so as to prevent the defects of the conventional arts.

SUMMARY OF THE INVENTION

In view of the defects of the conventional arts, the present invention is directed to an assembly device, so as to lower the manufacturing cost of the circuit board.

The present invention is also directed to an assembly device, so as to improve the yield of the manufacturing process of the circuit board.

In order to achieve the above and other objectives, the present invention provides an assembly device for assembling an isolation cover to a main body of a circuit board. The main body and the isolation cover respectively have a plurality of first positioning portions and a plurality of second positioning portions corresponding to each other. The second positioning portions correspondingly pass through the first positioning portions, respectively. The assembly device includes: a base, having a supporting portion for disposing the isolation cover and the main body; a press-fitting mechanism, movably connected to the base and having a press-fitting portion facing the supporting portion; and a drive mechanism, disposed at the base and having a drive portion connected to the press-fitting mechanism, for driving the press-fitting mechanism to move towards the supporting portion of the base via the drive portion, so as to bend and fasten ends of the second positioning portions.

In the assembly device, the base is an L-shaped base including a bottom portion and a stand column perpendicular to the bottom portion. The base has a height adjuster at the bottom portion, the supporting portion disposed on the height adjuster, and a first sliding portion disposed on the stand column. In an embodiment, the supporting portion may be a separate element. It should be understood that, the supporting portion may also be integrally disposed on one of the base and the height adjuster. The press-fitting mechanism includes a second sliding portion corresponding to the first sliding portion. The first sliding portion and the second sliding portion are a sliding rail and a sliding block corresponding to each other. Meanwhile, the supporting portion may have a first groove and a second groove respectively for disposing the main body and the isolation cover.

In an embodiment, the press-fitting mechanism may include a press-fitting portion disposed corresponding to the supporting portion, guiding and bending portions for guiding and bending the second positioning portions, first restricting portions for holding the guiding and bending portions to side faces of the press-fitting portion, and second restricting portions passing through upper ends of the guiding and bending portions. The press-fitting portion is a press-fitting block. The guiding and bending portions are baffles disposed on the side faces of the press-fitting portion. Each of the guiding and bending portions has a chamfer at a lower end thereof and a third restricting portion disposed on a side face thereof. The first restricting portions are bolts or latches. The second restricting portions are connecting rods with springs sleeved thereon. The third restricting portions are guiding slots.

It should be noted that, the guiding and bending portions, the first restricting portions, the second restricting portions, and other detailed structures may also be optionally omitted, with only the press-fitting portion being provided with a groove. The groove may be, for example, an arc-shaped groove. Thus, the second positioning portions may be directly flattened without performing the bending operation first, thereby simplifying the structure.

Moreover, the drive mechanism may include a connecting portion connected to the drive portion and an actuating portion connected to the connecting portion and the base. The drive portion is a link rod. The connecting portion is a connecting arm or a link rod. In such a manner, the operations may be, for example, performed with less force by utilizing the lever principle. It should be understood that, pneumatic, electromagnetic, hydraulic, or piezoelectric link rod drive mechanisms, or other equivalent drive mechanisms that can drive the press-fitting mechanism may also be applied, but the present invention is not limited to this.

As compared with the conventional art, in the present invention, an assembly device is designed to assemble the isolation cover to the main body in a press-fitting manner, so that it is not necessary to use a lower frame and to solder by using solder as in the conventional art. Therefore, the manufacturing cost of the circuit board is lowered, the yield of the manufacturing process of the circuit board is improved, and a stable positioning effect is kept. Meanwhile, when the technology of the present invention is applied, elements on the circuit board can be replaced without a desoldering process, which is convenient for maintenance.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

The implementation of the present invention is described with specific detailed embodiments as follows, and those of ordinary skill in the art may easily understand other advantages and efficacies of the present invention from the content of the specification.

Figure 1:
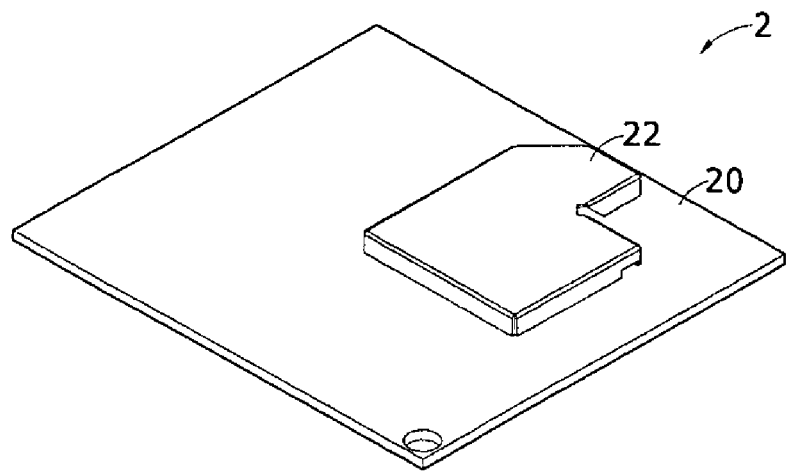
FIG. 1 is a schematic view of a conventional circuit board having a single-piece fully soldered isolation cover.
Figure 2:
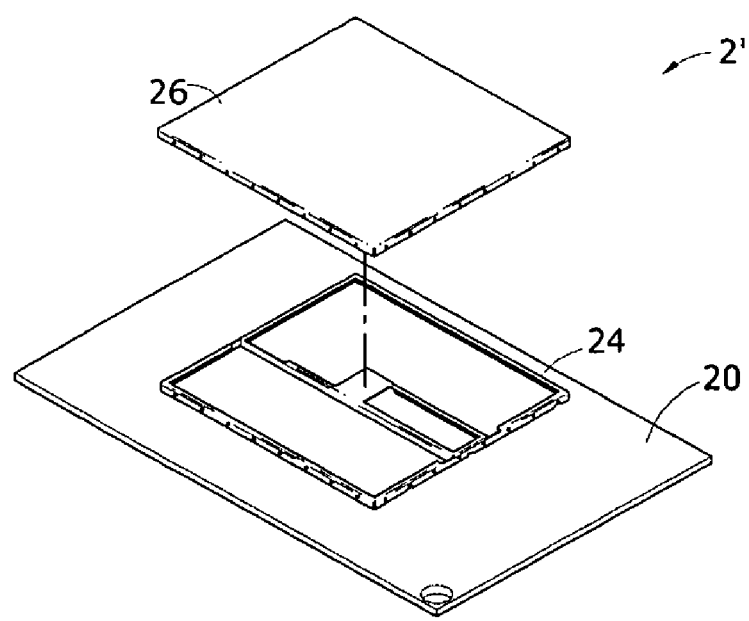
FIG. 2 is a schematic view of a conventional circuit board having a two-piece fully soldered isolation cover.
Figure 3:
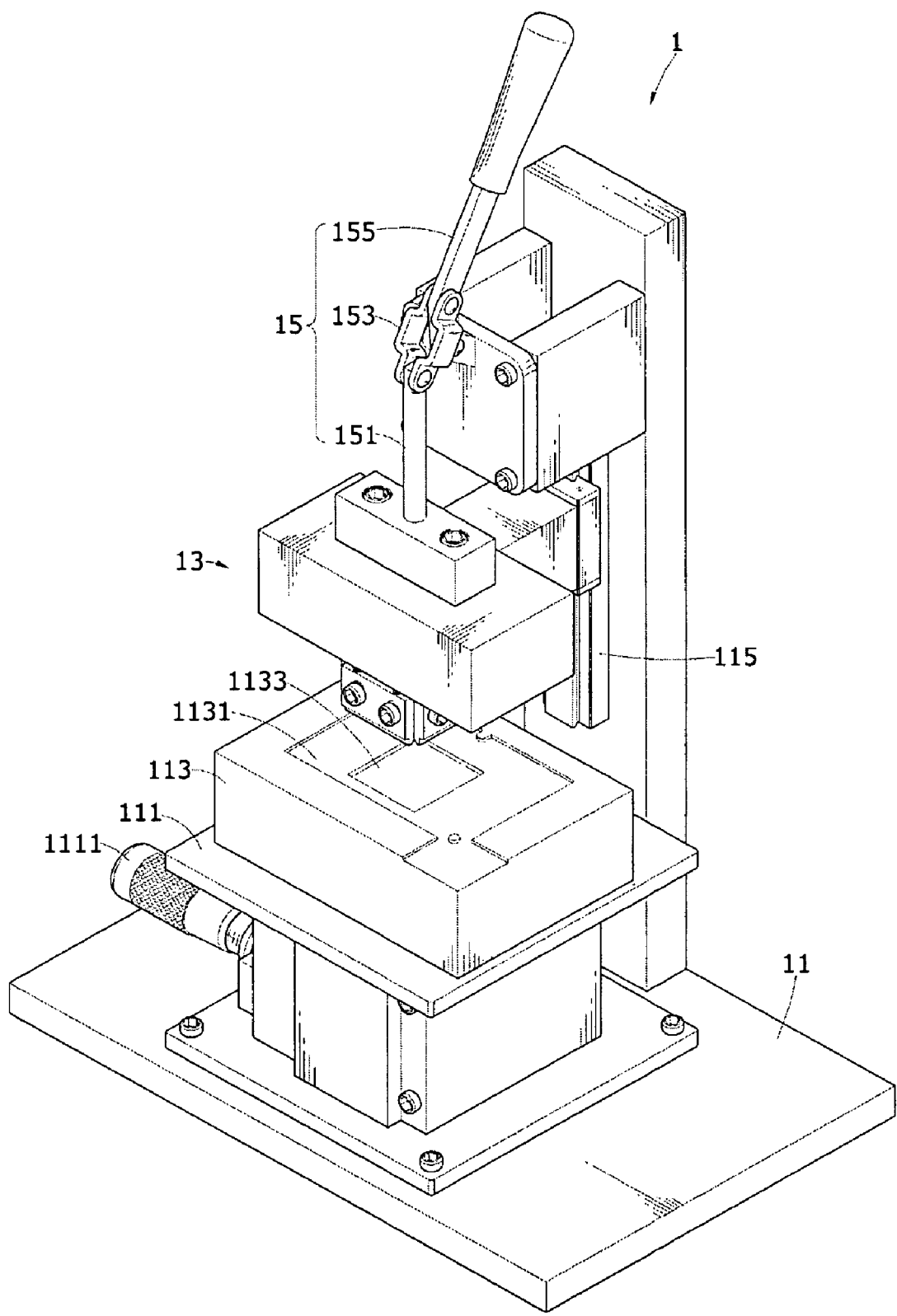
FIG. 3 is a schematic view of an assembly device according to an embodiment of the present invention.

FIGS. 3-6g are schematic views of an assembly device according to an embodiment of the present invention. Referring to FIG. 3, an assembly device 1 of this embodiment includes a base 11, a press-fitting mechanism 13 movably connected to the base 11, and a drive mechanism 15 connected to the press-fitting mechanism 13.

Figure 4:
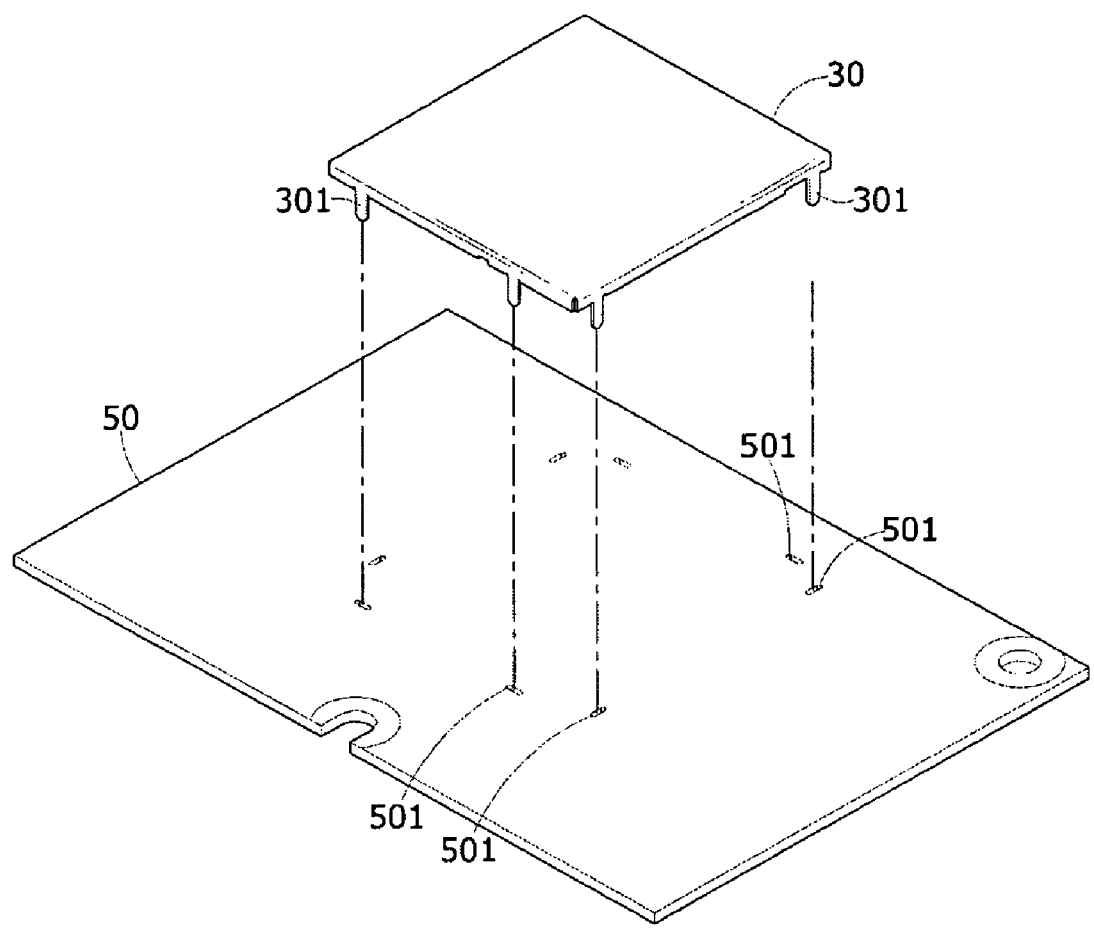
FIG. 4 is a schematic exploded view of an isolation cover and a main body of a circuit board.

It should be noted that, the assembly device 1 of this embodiment is applicable to assembling an isolation cover 30 to a main body 50 as shown in FIG. 4. The main body 50 and the isolation cover 30 respectively have a plurality of first positioning portions 501 and a plurality of second positioning portions 301 corresponding to each other. The second positioning portions 301 correspondingly pass through the first positioning portions 501, respectively. The isolation cover 30 may be disposed on one surface of the main body 50 such that the second positioning portions 301 pass through the other surface of the main body 50 via the first positioning portions 501. The assembly can be completed simply by bending ends of the second positioning portions 301 to contact the other surface by the assembly device 1 of this embodiment. It should be understood that, in practice, the isolation cover 30 and the main body 50 of the circuit board may be modified in structure, and the modifications are applicable to the present invention as long as they have a plurality of first positioning portions 501 and a plurality of second positioning portions 301 corresponding to each other and the second positioning portions 301 correspondingly pass through the first positioning portions 501, respectively. Meanwhile, the number of the first positioning portions 501 may be larger than that of the second positioning portions 301, so that even different isolation covers 30 are applicable to the main body 50, thus improving adaptability.

The base 11 is a device stage for providing support to the press-fitting operation and may be, for example, an L-shaped base including a bottom portion and a stand column perpendicular to the bottom portion. In this embodiment, the base 11 has a height adjuster 111 at the bottom portion, a supporting portion 113 disposed on the height adjuster 111, and a first sliding portion 115 disposed on the stand column. The height adjuster 111 may be any structure or element that can adjust the height, for example, lift up or bring down the supporting portion 113 simply by rotating an operation portion 1111 of the height adjuster 111, so as to move the supporting portion 113. The supporting portion 113 is, for example, an object stage, and has a first groove 1131 and a second groove 1133 respectively for disposing the main body 50 and the isolation cover 30. The size of the first groove 1131 is larger than that of the second groove 1133, and the first groove 1131 and the second groove 1133 are positioned to guide the second positioning portions 301 to fit to the first positioning portions 501 respectively.

It should be understood that, in this embodiment, the driving stroke of the drive mechanism 15 is set as a fixed stroke so as to control the press-fitting mechanism 13 to bend the ends of the second positioning portions 301 to contact the other surface of the main body 50 only, but not press the main body 50 in the press-fitting process, thereby preventing the main body 50 from being damaged. In other embodiments, the driving stroke of the drive mechanism 15 may also be modified to be an adjustable stroke so as to control the driving stroke by other structures or elements, so that the height adjuster 111 can be omitted. Meanwhile, in this embodiment, the supporting portion 113 is disposed in addition to the height adjuster 111 to serve as an object stage. In this manner, when the structures or dimensions of the main body 50 and the isolation cover 30 to be assembled change, the assembly can be performed by replacing a suitable supporting portion 113. However, it should be understood by those of ordinary skill in the art that, the supporting portion 113 may also be integrally disposed on the base 11 or the height adjuster 111, but not limited to that described in this embodiment.

Figure 5:
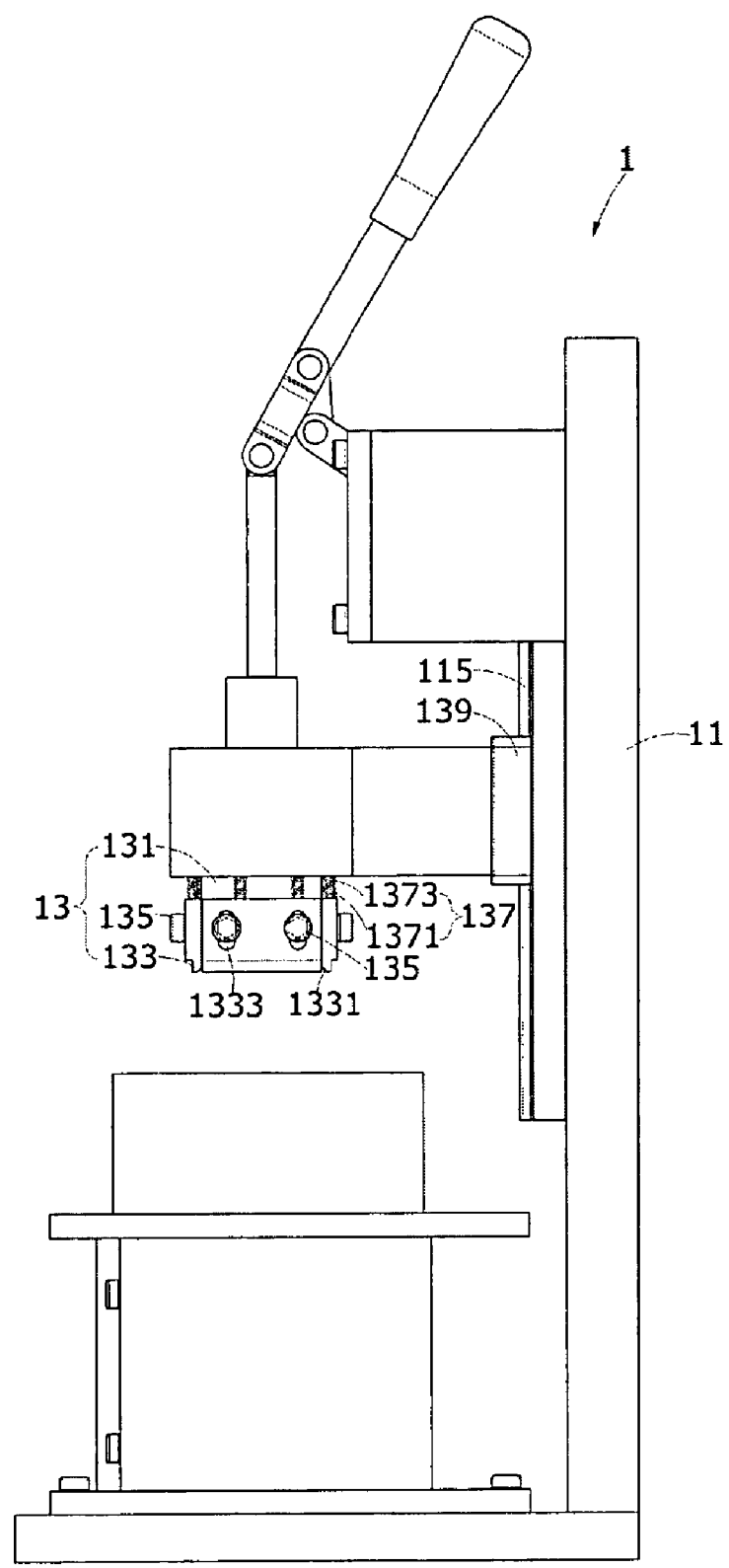
FIG. 5 is a partial enlarged schematic view of an assembly device according to an embodiment of the present invention.

Referring to FIG. 5, the press-fitting mechanism 13 includes a press-fitting portion 131 facing the supporting portion 113, guiding and bending portions 133 for guiding and bending the second positioning portions 301, first restricting portions 135 for holding the guiding and bending portions 133 to side faces of the press-fitting portion 131, second restricting portions 137 passing through upper ends of the guiding and bending portions 133, and a second sliding portion 139 corresponding to the first sliding portion 115.

In this embodiment, the press-fitting portion 131 may be a press-fitting block having a dimension larger than or equal to that of the isolation cover 30. The guiding and bending portions 133 are disposed on the side faces of the press-fitting portion 131 and are, for example, retractable baffles. Lower ends of the guiding and bending portions 133 protrude from a surface of the press-fitting portion 131.

Each of the guiding and bending portions 133 has a chamfer 1331 at the lower end thereof and a third restricting portion 1333 disposed on a side face thereof. The chamfers 1331 are inclined from a side facing the press-fitting portion 131 toward a side away from the press-fitting portion 131.

The first restricting portions 135 may be, for example, bolts or latches. The third restricting portions 1333 may be, for example, guiding slots, for the first restricting portions 135 to provide the moving stroke of the third restricting portions 1333.

The second restricting portions 137 may be connecting rods 1373 with springs 1371 sleeved thereon. Here, the connecting rods 1373 can pass through the upper ends of the guiding and bending portions 133 and then connected to the first restricting portions 135. When the press-fitting portion 131 is driven to press downward, the guiding and bending portions 133 will contact the main body 50 and the isolation cover 30 to be assembled first, and the first restricting portions 135 may restrict the linear movement of the third restricting portions 1333. In this manner, as the press-fitting portion 131 continues to be driven and thus is brought into contact with the main body 50 and the isolation cover 30 to be assembled, the guiding and bending portions 133 may move toward the second restricting portions 137 (in an upward direction), thereby keeping the press-fitting portion 131 and the guiding and bending portions 133 approximately coplanar.

The second sliding portion 139 is disposed corresponding to the first sliding portion 115 of the base 11, and the first sliding portion 115 and the second sliding portion 139 may be a sliding rail and a sliding block corresponding to each other. That is, in this embodiment, the first sliding portion 115 is a sliding rail and the second sliding portion 139 is a sliding block. However, in other embodiments, the first sliding portion 115 may also be designed as a sliding block, and the second sliding portion 139 may be designed as a sliding rail. It should be understood that, in other embodiments, the first sliding portion 115 and the second sliding portion 139 may also be modified to be other equivalent elements, such as a rack (chain) and a gear, that can move linearly corresponding to each other, but not limited to those described in this embodiment.

The drive mechanism 15 is disposed at the base 11, for example, fixed to the stand column of the base 11, and is used to uniformly press the press-fitting mechanism 13 downward. In this embodiment, the drive mechanism 15 may include a drive portion 151 connected to the press-fitting mechanism 13, a connecting portion 153 connected to the drive portion 151, and an actuating portion 155 connected to the connecting portion 153 and the stand column of the base 11. The drive portion 151 is used to move the press-fitting mechanism 13 so as to bend and fasten the ends of the second positioning portions 301. In addition, the drive portion 151 may be a link rod for moving the press-fitting portion 131 up and down, so as to drive the press-fitting portion 131 to bend the second positioning portions 301. It should be noted that, although the assembly is performed by moving the press-fitting portion 131 up and down in this embodiment, the manner of moving the press-fitting portion 131 left and right may also be used in other embodiments. Other manners are also applicable to the present invention, as long as the drive mechanism 15 is used to drive the press-fitting mechanism 13 to move toward the supporting portion 113 of the base 11 via the drive portion 151 so as to bend and fasten the ends of the second positioning portions 301.

In this embodiment, two connecting arms are disposed to serve as the connecting portion 153. However, it should be understood that, the connecting portion 153 may also be a link rod or other equivalent connecting elements coupled to the drive portion 151 and the actuating portion 155. The actuating portion 155 is pivoted to the stand column of the base 11 at one end thereof and is pivoted to the connecting portion 153 at an approximately central portion thereof, and the other end thereof can press the actuating portion 155 downward to drive the press-fitting portion 131 to move downward.

Figure 6A:
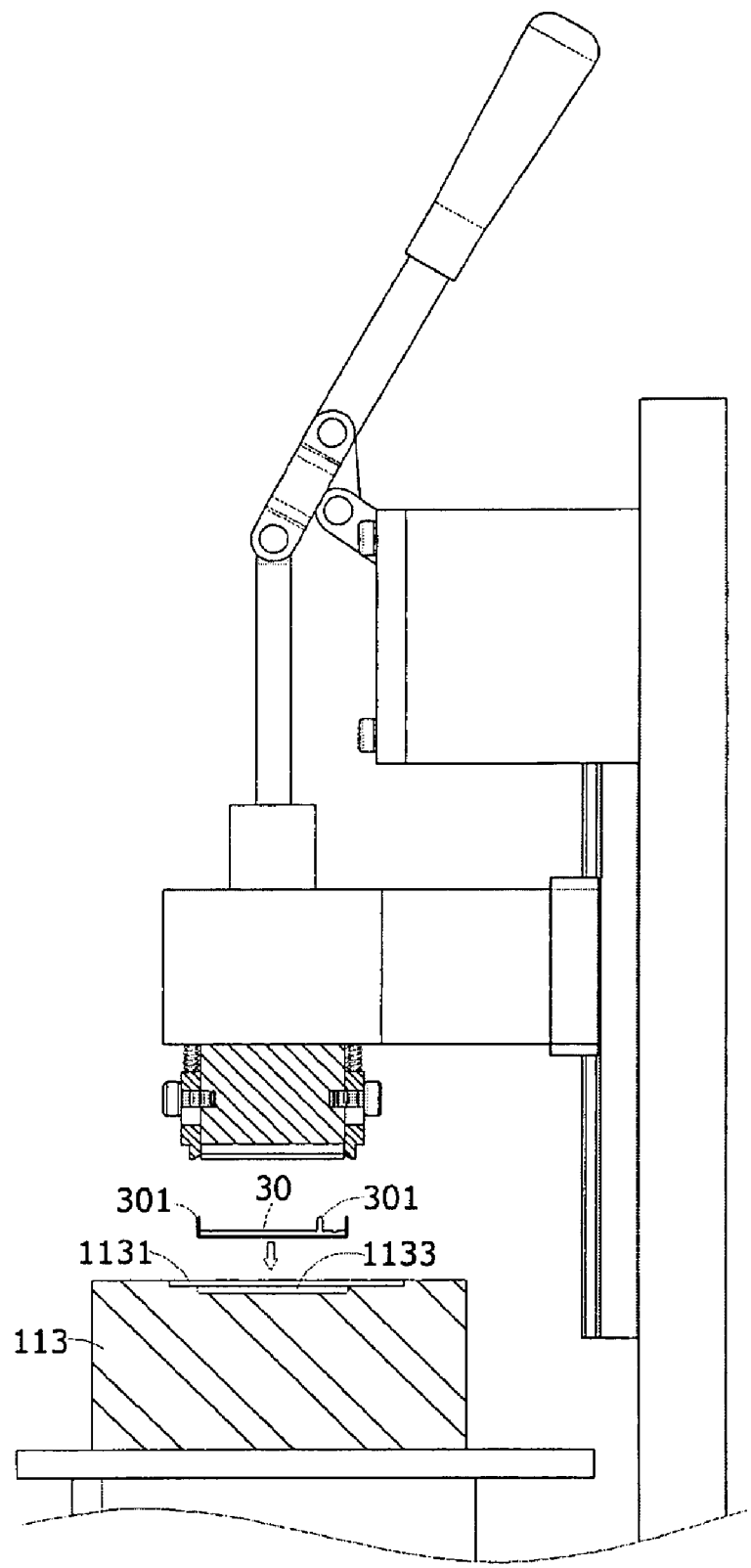
FIGS. 6a-6g show a flow chart of a process for assembling the circuit board in FIG. 4 by using the assembly device in FIG. 3.
Figure 6B:
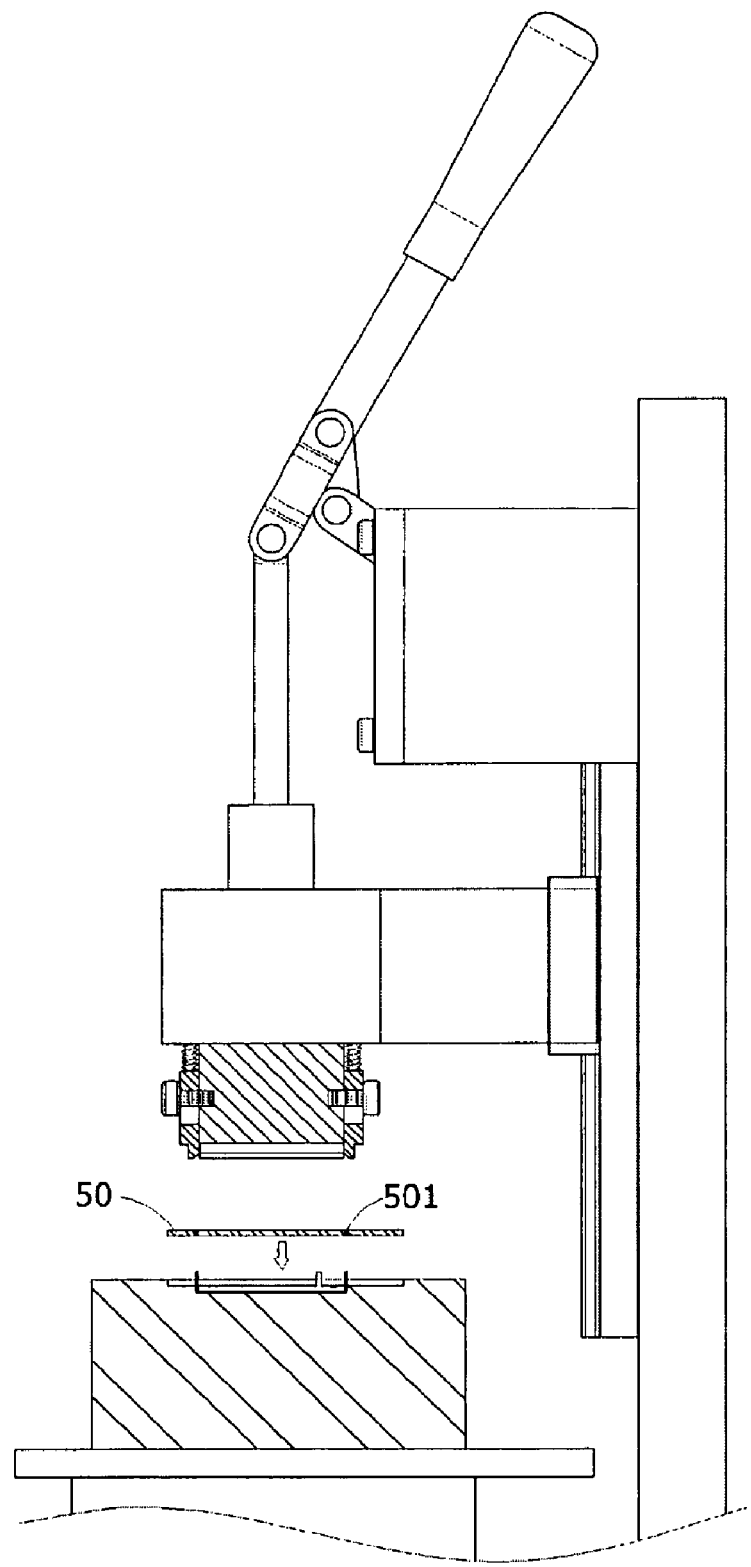

When it is intended to assemble the isolation cover 30 to the main body 50, the main body 50 and the isolation cover 30 to be assembled can be provided to the supporting portion 113. The isolation cover 30 may be disposed in the second groove 1133 first as shown in FIG. 6a, and the main body 50 is then disposed in the first groove 1131 as shown in FIG. 6b. In this manner, the isolation cover 30 is disposed on one surface of the main body 50 such that the second positioning portions 301 pass through the other surface of the main body 50 via the first positioning portions 501.

It should be noted that, since the technology of press-fitting assembly is adopted in the present invention, the isolation cover 30 can be disposed on the main body 50 after the circuit board passes through the tin stove. In this manner, it can be inspected whether the elements fail or not immediately after the circuit board passes through the tin stove, thereby reducing the defective fraction of the manufacturing process of the circuit board.

Meanwhile, although the isolation cover 30 and the main body 50 are combined together manually first and then put into the supporting portion 113 in the operation mode of this embodiment, the isolation cover 30 and the main body 50 may also be combined together by using an automatic production line first and then put into the supporting portion 113 in other embodiments.

Figure 6C:
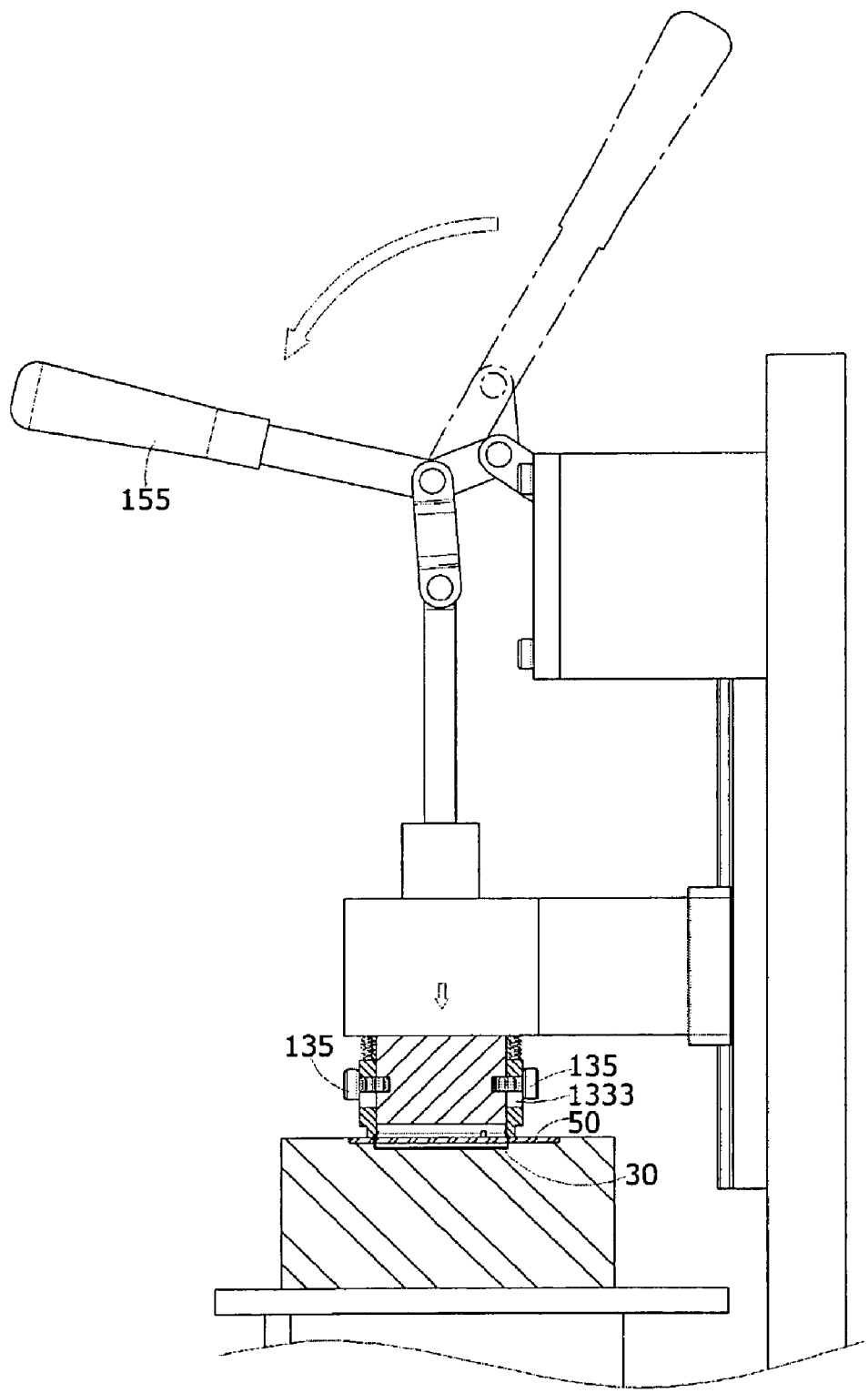
Figure 6D:
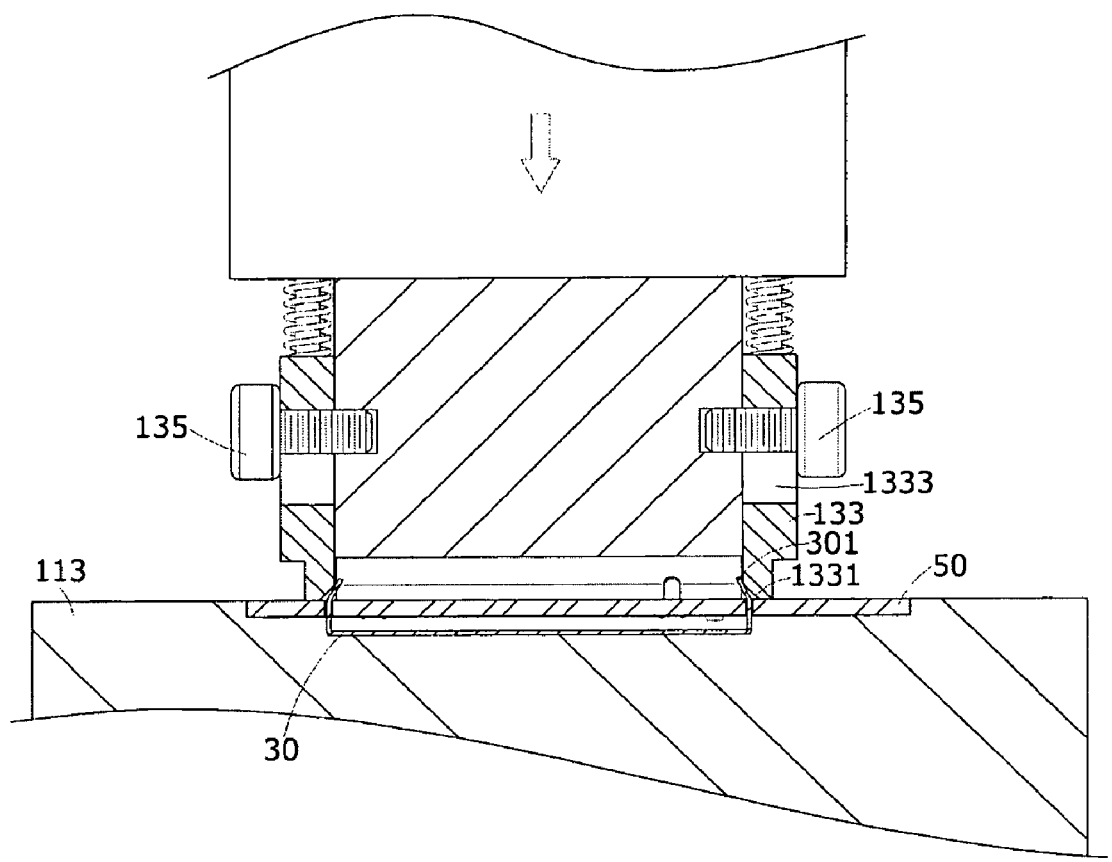
Figure 6E:
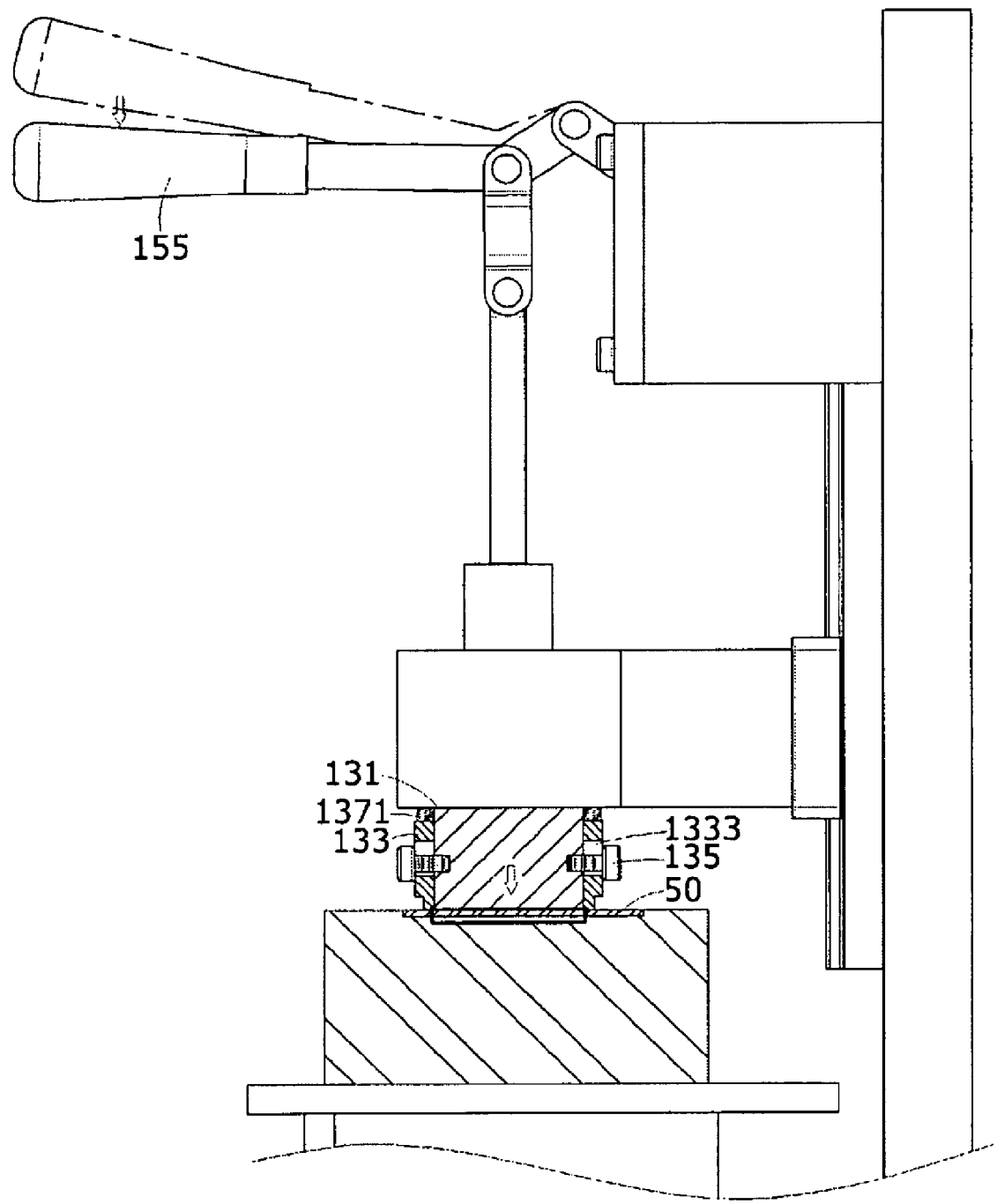
Figure 6F:
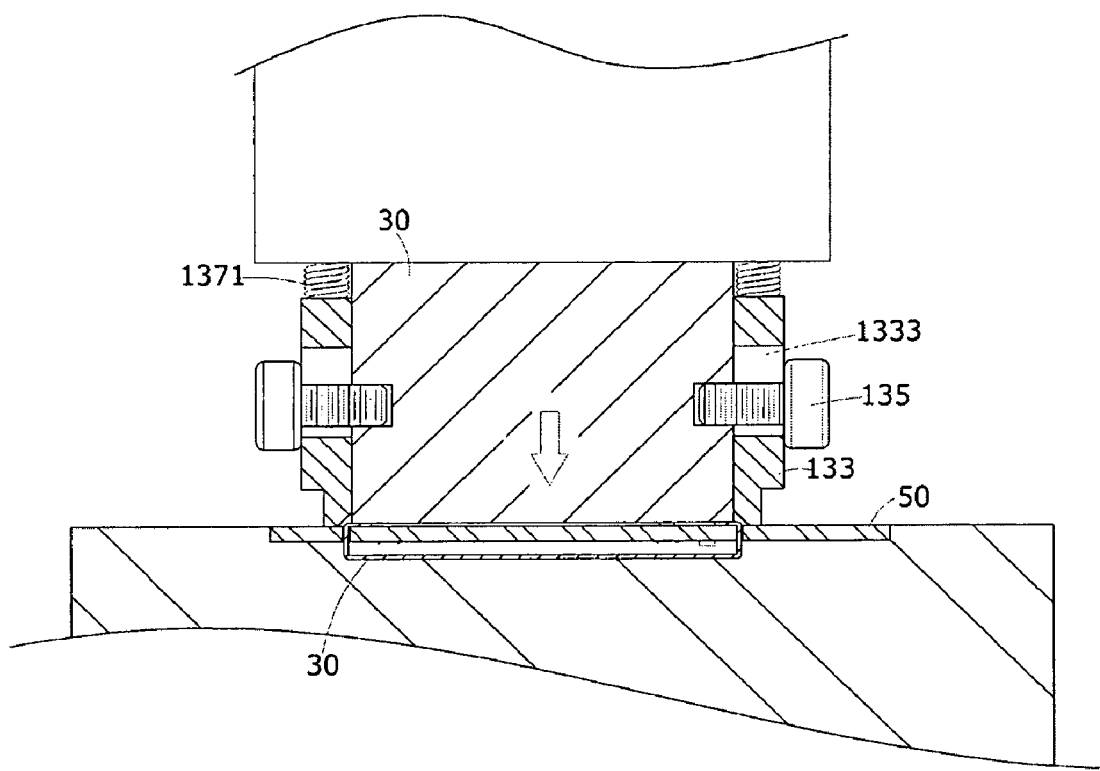

Then, the actuating portion 155 is pressed downward, as shown in FIGS. 6c and 6d. In this step, the second positioning portions 301 may be guided to a direction to be bent by the guiding and bending portions 133 in advance before press-fitting. In this embodiment, the chambers 1331 may in contact with the ends of the second positioning portions 301 first, so as to prebend the second positioning portions 301. As the downward pressing continues to be performed, when the press-fitting portion 131 contacts the main body 50 and the isolation cover 30 to be assembled on the supporting portion 113, as shown in FIGS. 6e and 6f, the guiding and bending portions 133 may move upward and the first restricting portions 135 are located below the third restricting portions 1333, such that the press-fitting portion 131 and the guiding and bending portions 133 are maintained coplanar. At this time, the springs 1371 are compressed due to the upward movement of the guiding and bending portions 133, so that the springs 1371 release the elastic restoring force generated by compression after the downward pressing action is finished, thereby pushing the guiding and bending portions 133 back to their original positions.

Figure 6G:
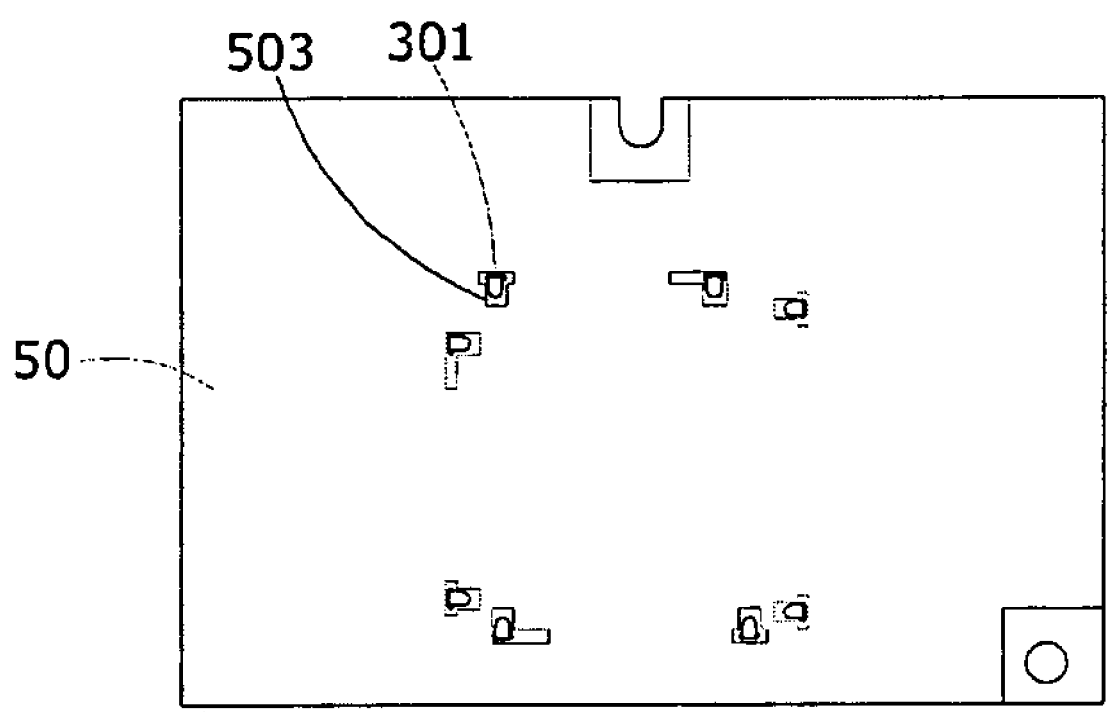

Referring to FIG. 6g, the ends of the second positioning portions 301 may be bent to contact the surface of the main body 50, for example, contact ground portions 503 of the main body 50.

Since the drive mechanism 15 of this embodiment is, for example, a link rod drive mechanism designed according to the lever principle and having a long arm of force, it is force-saving. Here, it should be understood that, the drive mechanism 15 may also be modified into other mechanical linear drive mechanisms such as pneumatic, electromagnetic, hydraulic, oil-pressure, or piezoelectric linear drive mechanisms, but not limited to those described in this embodiment. For example, the drive mechanism 15 may be a linear drive mechanism including a ratchet wheel and a gear set engaged with the ratchet wheel.

It should be appreciated that, although the drive mechanism 15 is pressed downward in the above press-fitting step, the assembly actions may be inverted in other embodiments, since positions of the drive mechanism 15 and the press-fitting mechanism 13 may be inverted. For example, when the press-fitting mechanism 13 is disposed above the drive mechanism 15, the drive mechanism 15 needs to be pulled upward for press-fitting. Meanwhile, in order to provide a uniform force for press-fitting, pneumatic (hydraulic) press-fitting may be used to replace manual press-fitting. Alternatively, weight press-fitting or other equivalent press-fitting technologies may also be adopted. For example, when the pneumatic (hydraulic) press-fitting is used, the height adjuster 111 may be omitted, since the height of the press-fitting mechanism 13 to be driven can be controlled by the stroke of a pneumatic (hydraulic) cylinder. In other words, those of ordinary skill in the art may modify the detailed structures of the press-fitting mechanism 13 or invert the positions of the press-fitting mechanism 13 and the drive mechanism 15. Meanwhile, since the modifications can be understood and implemented by those of ordinary skill in the art, corresponding drawings are omitted herein.

Figure 7:
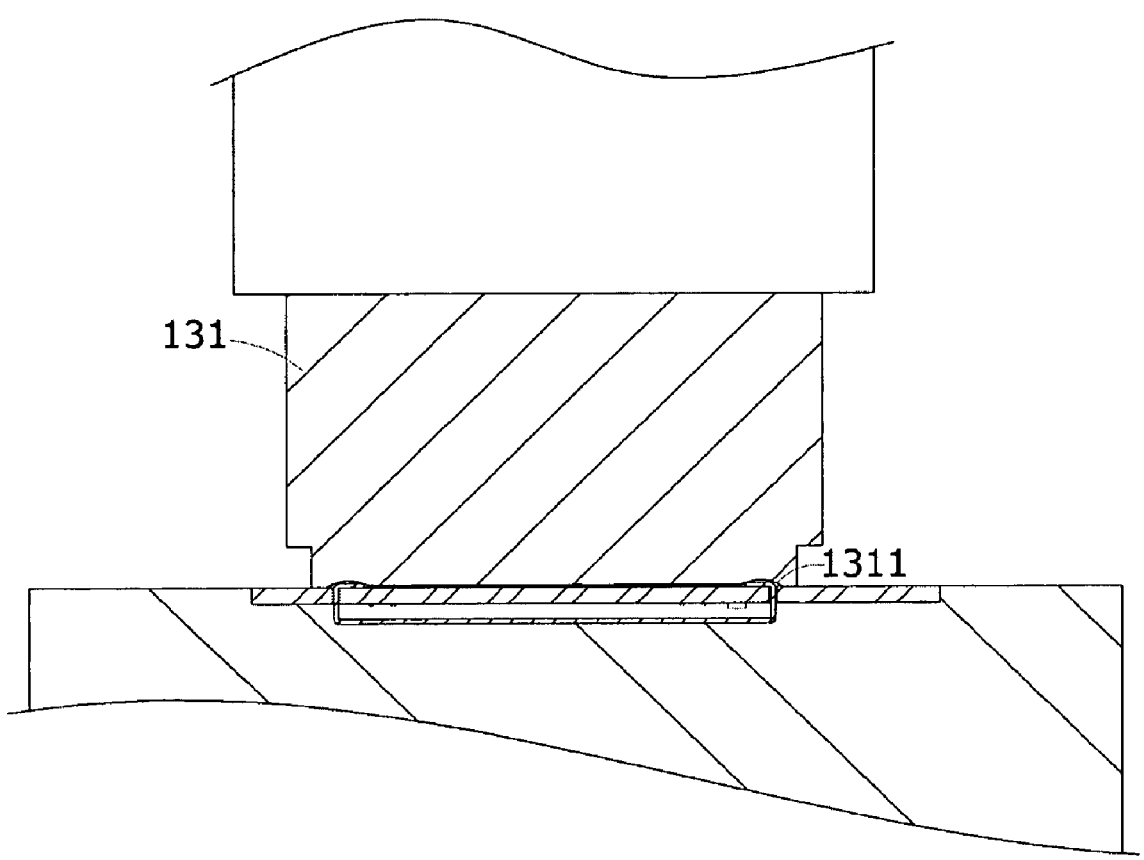
FIG. 7 is a partial enlarged schematic view of an assembly device according to another embodiment of the present invention.

For example, referring to FIG. 7, the press-fitting portion 131 may be provided with a groove 1311. For example, the groove 1311 may be, but not limited to, an arc-shaped groove. Any kind of groove is applicable to the present invention, as long as they can bend the ends of the second positioning portions 301 to contact the surface of the main body 50. In other words, in this embodiment, the second positioning portions are guided and bent first, and then flattened to contact the corresponding ground portions. However, in other embodiments, the second positioning portions may be directly flattened to contact the corresponding ground portions, or flattened after being passed through the first positioning portions in other manners. Moreover, the guiding and bending portions 133, the first restricting portions 135, the second restricting portions 137, and other detailed structures may thus be omitted. Moreover, in this embodiment, the size and shape of the contact surface of the press-fitting portion 131 contacting the isolation cover 30 may be designed such that only peripheries of the isolation cover 30 are pressed, thereby preventing the center of the isolation cover 30 from being pressed.

Moreover, in this embodiment, the isolation cover 30 is disposed first such that the second positioning portions 301 of the isolation cover 30 face upward, and the main body 50 is then disposed. However, in other embodiments, the main body 50 may also be disposed first, and the isolation cover 30 is then disposed such that the second positioning portions 301 face downward. Therefore, in the present invention, not only the assembly actions may be inverted, but the objects to be assembled may also be inverted.

The above embodiments are merely intended to illustrate the principles and efficacies of the present invention, but not to limit the present invention. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An assembly device for assembling an isolation cover to a main body of a circuit board, the main body having a plurality of first positioning portions, the isolation cover having a plurality of second positioning portions, the second positioning portions corresponding in position to and passing through the first positioning portions, respectively, the assembly device comprising:
   a base having a supporting portion upon which the isolation cover and the main body are disposed;
   a press-fitting mechanism movably connected to the base the press-fitting mechanism including:
      a press-fitting portion facing the supporting portion and disposed corresponding in position to the supporting portion;
      guiding and bending portions for guiding and bending the second positioning portions, the guiding and bending portions being movably disposed on external side faces of the press-fitting portion;
      first restricting portions for holding the guiding and bending portions to the external side faces of the press-fitting portion; and
      second restricting portions passing through upper ends of the guiding and bending portions; and
   a drive mechanism disposed at the base and having a drive portion connected to the press-fitting mechanism, for driving the press-fitting mechanism to move towards the supporting portion via the drive portion, so as to bend and fasten ends of the second positioning portions.

2. The assembly device according to claim 1, wherein the base is an L-shaped base comprising a bottom portion and a stand column perpendicular to the bottom portion.

3. The assembly device according to claim 2, wherein the base has a height adjuster at the bottom portion, the supporting portion disposed on the height adjuster, and a first sliding portion disposed on the stand column.

4. The assembly device according to claim 3, wherein the supporting portion is integrally disposed on one of the base and the height adjuster.

5. The assembly device according to claim 3, wherein the press-fitting mechanism comprises a second sliding portion corresponding to the first sliding portion.

6. The assembly device according to claim 5, wherein the first sliding portion and the second sliding portion are a sliding rail and a sliding block corresponding to each other.

7. The assembly device according to claim 1, wherein the supporting portion has a first groove and a second groove respectively for disposing the main body and the isolation cover.

8. The assembly device according to claim 1, wherein the press-fitting portion is a press-fitting block.

9. The assembly device according to claim 1, wherein the guiding and bending portions are baffles disposed on the side faces of the press-fitting portion.

10. The assembly device according to claim 1, wherein each of the guiding and bending portions has a chamfer at a lower end thereof and a third restricting portion disposed on a side face thereof.

11. The assembly device according to claim 10, wherein the chamfers are inclined from a side facing the press-fitting portion toward a side away from the press-fitting portion.

12. The assembly device according to claim 10, wherein the third restricting portions are guiding slots.

13. The assembly device according to claim 1, wherein the first restricting portions are bolts or latches.

14. The assembly device according to claim 1, wherein the second restricting portions are connecting rods with springs sleeved thereon.

15. The assembly device according to claim 1, wherein the press-fitting portion is provided with a groove.

16. The assembly device according to claim 15, wherein the groove is an arc-shaped groove.

17. The assembly device according to claim 1, wherein the drive portion is a link rod.

18. The assembly device according to claim 10, wherein the first restricting portions penetrate the third restricting portion from one side of the third restricting portion to another side thereof.

19. The assembly device according to claim 1, wherein lower ends of the guiding and bending portions protrude from a surface of the press-fitting portion.

20. The assembly device according to claim 1, wherein the guiding and bending portions are configured to move toward the second restricting portions when the main body and the isolation cover is assembly, and keep the guiding and bending portions and the press-fitting portion approximately coplanar.

* * * * *